United States Patent
Floyd et al.

(10) Patent No.: US 8,421,478 B2
(45) Date of Patent: Apr. 16, 2013

(54) RADIO FREQUENCY INTEGRATED CIRCUIT WITH ON-CHIP NOISE SOURCE FOR SELF-TEST

(75) Inventors: Brian Allan Floyd, Mahopac, NY (US); David Ross Greenberg, White Plains, NY (US); Ramana Murty Malladi, Williston, VT (US); Bradley Alan Orner, Cambridge, VT (US); Scott Kevin Reynolds, Amawalk, NY (US)

(73) Assignee: International Business Machines Corporation, Armonk, NY (US)

( * ) Notice: Subject to any disclaimer, the term of this patent is extended or adjusted under 35 U.S.C. 154(b) by 1108 days.

(21) Appl. No.: 12/019,913

(22) Filed: Jan. 25, 2008

(65) Prior Publication Data

US 2009/0190640 A1    Jul. 30, 2009

(51) Int. Cl.
*G01R 29/26*    (2006.01)
(52) U.S. Cl.
USPC .......................... 324/614; 324/613
(58) Field of Classification Search .................. 324/614, 324/613, 612, 600; 455/67.12; 374/1
See application file for complete search history.

(56) References Cited

U.S. PATENT DOCUMENTS

| | | | |
|---|---|---|---|
| 3,967,187 A | 6/1976 | Edwards | |
| 4,742,561 A | 5/1988 | Tipton | |
| 4,772,945 A | 9/1988 | Tagawa et al. | |
| 5,374,907 A | 12/1994 | Orita et al. | |
| 5,416,422 A | 5/1995 | Dildine | |
| 5,532,705 A * | 7/1996 | Hama | 343/718 |
| 5,554,860 A | 9/1996 | Seabaugh | |
| 5,585,974 A | 12/1996 | Shrinkle | |
| 5,737,342 A | 4/1998 | Ziperovich | |
| 5,818,120 A * | 10/1998 | Palara | 307/10.6 |
| 6,217,210 B1 | 4/2001 | Roeder et al. | |
| 6,744,322 B1 * | 6/2004 | Ma et al. | 330/300 |
| 6,779,144 B2 | 8/2004 | Hayashi et al. | |
| 6,834,991 B2 | 12/2004 | Roeder | |
| 6,917,789 B1 | 7/2005 | Moloudi et al. | |
| 7,082,293 B1 | 7/2006 | Rofougaran et al. | |
| 7,139,540 B2 | 11/2006 | Wu et al. | |
| 7,233,772 B1 | 6/2007 | Darabi et al. | |

(Continued)

FOREIGN PATENT DOCUMENTS

| EP | 1533373 A1 | 5/2003 |
|---|---|---|
| EP | 1533373 A4 | 11/2006 |

(Continued)

OTHER PUBLICATIONS

Agilent Technologies, "Fundamentals of RF and Microwave Noise Figure Measurements," Application Note 57-1, Oct. 2006, pp. 1-32.

(Continued)

*Primary Examiner* — Hoai-An D Nguyen
(74) *Attorney, Agent, or Firm* — Anne V. Dougherty; Ryan, Mason & Lewis, LLP (57) ABSTRACT

Radio frequency integrated circuits with on-chip noise source for use in the performance of tests and/or calibrations. A radio frequency integrated circuit includes at least one noise source residing on the radio frequency integrated circuit, the noise source being controllable by a digital input, and a radio frequency circuit residing on the radio frequency integrated circuit and being coupled to the noise source, wherein at least one attribute of the radio frequency circuit is determinable by controlling the noise source via the digital input.

19 Claims, 6 Drawing Sheets

U.S. PATENT DOCUMENTS

2006/0246436 A1 11/2006 Ohno et al.
2006/0264192 A1* 11/2006 Kuo et al. ............... 455/232.1
2007/0159218 A1* 7/2007 Srinivas et al. ............. 327/108
2007/0238431 A1 10/2007 Zhan et al.

FOREIGN PATENT DOCUMENTS

| | | |
|---|---|---|
| JP | 2004000018 A | 1/2004 |
| JP | 4035600 B2 | 1/2008 |
| WO | 03/097830 A1 | 11/2003 |

OTHER PUBLICATIONS

Agilent Technologies, "Noise Figure Measurement Accuracy—The Y-Factor Method," Application Note 57-2, Mar. 2004, pp. 1-44.

Agilent Technologies, "10 Hints for Making Successful Noise Figure Measurements," Application Note 57-3, Nov. 2000, pp. 1-20.

D. Greenberg et al., "Low-Noise Performance Near BV/sub CEO/ in a 200 GHz SiGe Technology at Different Collector Design Points," IEEE MTT-S International Microwave Symposium Digest, Jun. 2003, pp. 113-116, vol. 1.

G. Evans et al., "On-Chip Built-In Self-Test of Video-Rate ADCs Using a 1.5 V CMOS Gaussian Noise Generator," IEEE Conference on Electron Devices and Solid-State Circuits (EDSSC), Dec. 2005, pp. 669-672.

J.C.J. Paasschens et al., "Modelling the Excess Noise Due to Avalanche Multiplication in (Hetero-Junction) Bipolar Transistors," IEEE BCTM, 2004, pp. 108-111.

* cited by examiner

RADIO FREQUENCY INTEGRATED CIRCUIT WITH ON-CHIP NOISE SOURCE FOR SELF-TEST

FIELD OF THE INVENTION

The present invention relates to radio frequency integrated circuits and, more particularly, to techniques for use in the performance of tests on such radio frequency integrated circuits.

BACKGROUND OF THE INVENTION

The noise figure (NF) and insertion gain of a radio receiver integrated circuit (IC) are often measured by applying two different levels of input noise and measuring the output power change, see, e.g., "Fundamentals of RF and Microwave Noise Figure Measurements," Agilent Technologies Application Note 57-1, Oct. 12, 2006, "Noise Figure Measurement Accuracy—The Y-Factor Method," Agilent Technologies Application Note 57-2, Mar. 19, 2004, and "10 Hints for Making Successful Noise Figure Measurements," Agilent Technologies Application Note 57-3, Nov. 21, 2000, the disclosures of which are incorporated by reference herein.

The two different levels of noise are provided by a noise source, which often consists of a low-capacitance diode reverse biased into avalanche breakdown. However, at millimeter (mm) wave frequencies (approximately greater than 30 Gigahertz or GHz), the noise sources are expensive and difficult to manufacture. Furthermore, they are usually supplied with waveguide connectors which are difficult to connect to the radio frequency integrated circuit (RFIC) which is being tested. The wafer probes which are used to make electrical contact to the RFIC under test are themselves expensive and fragile, and they require precise mechanical manipulation to provide reproducible results.

An RFIC which has multiple RF inputs presents a particular problem, because any switch which might be used to switch one noise source to multiple RFIC inputs has insertion loss which interferes with the measurement accuracy, and the need to switch the noise source to multiple RFIC inputs also slows down the measurement, which is highly undesirable in a manufacturing environment. For instance, a receiver for a 4×4 phased-antenna array would have 16 inputs, and it would be prohibitive from a cost standpoint to provide 16 noise sources, while it would be unacceptable from a test time and test accuracy standpoint to switch one noise source to 16 RFIC inputs. Therefore, the techniques used to perform manufacturing tests on RFICs at microwave frequencies may be unacceptable at mm-wave frequencies.

Many electronic systems and ICs incorporate self-test features, see, e.g., Roeder et al., U.S. Pat. No. 6,834,991; Shrinkle, U.S. Pat. No. 5,585,974; Darabi et al., U.S. Pat. No. 7,233,772; Wu et al., U.S. Pat. No. 7,139,540; Moloudi et al., U.S. Pat. No. 6,917,789; Ziperovich, U.S. Pat. No. 5,737,342; Rofougaran et al., U.S. Pat. No. 7,082,293; G. Evans et al., "On-Chip Built-In Self-Test of Video-Rate ADCs Using a 1.5 V CMOS Gaussian Noise Generator," 2005 *IEEE Conf. on Electron Dev. and Solid-State Circuits (EDSSC)*, pp. 669-672; Tagawa et al., U.S. Pat. No. 4,772,945; and Hayashi et al., U.S. Pat. No. 6,779,144, the disclosures of which are incorporated by reference herein.

ICs having self-test or calibration features and using on-chip noises are described in the above-referenced Shrinkle, Ziperovich, and G. Evans et al. Shrinkle and Ziperovich describe ICs which are tested with digital noise generators. These digital noise generators create white Gaussian noise using digital logic circuits which are switched in a pseudo-random sequence. However, such digital noise generators are not useful for testing the noise figure and insertion gain of an RFIC because the noise generators do not create noise at high enough frequencies to match the input frequencies of RFICs. G. Evans et al. use a noisy complementary metal oxide semiconductor (CMOS) operational amplifier to generate white noise, but such a noise source is also not useful for testing the noise figure and insertion gain of an RFIC because the noise is not at high enough frequencies.

Roeder et al. describe a system which is self-tested with an RF noise source at high frequencies. However, the system and noise source are not contained on an RFIC. Seabaugh, U.S. Pat. No. 5,554,860, the disclosure of which is incorporated by reference herein, describes a noise generator using a resonant tunneling transistor. However, the noise source is not used for self-test of an RFIC or system, and the noise source is not contained on an RFIC.

SUMMARY OF THE INVENTION

Principles of the invention provide radio frequency integrated circuits with on-chip noise source for use in the performance of tests and/or calibrations.

For example, in a first aspect of the invention, a radio frequency integrated circuit comprises at least one noise source residing on the radio frequency integrated circuit, the noise source being controllable by a digital input, and a radio frequency circuit residing on the radio frequency integrated circuit and being coupled to the noise source, wherein at least one attribute of the radio frequency circuit is determinable by controlling the noise source via the digital input.

The noise source may be integrated in the radio frequency circuit. For example, the noise source may be part of a low-noise amplifier of the radio frequency circuit.

The attribute of the radio frequency circuit determinable by controlling the noise source via the digital input may be a noise figure value and/or an insertion gain value. In one embodiment, control of the noise source results in applying two different levels of input noise to the radio frequency circuit and measuring an output power change of the radio frequency circuit.

The radio frequency circuit residing on the radio frequency integrated circuit preferably operates in approximately a millimeter wave frequency range. The radio frequency integrated circuit may operate as a radio receiver.

In a second aspect of the invention, a radio frequency integrated circuit comprises two or more noise sources residing on the radio frequency integrated circuit, the two or more noise sources being controllable by two or more digital inputs, and a radio frequency circuit with two or more radio frequency inputs, the radio frequency circuit residing on the radio frequency integrated circuit and being coupled to the two or more noise sources, wherein corresponding ones of the two or more noises sources are associated with corresponding ones of the two or more radio frequency inputs, and further wherein at least one attribute of the radio frequency circuit is determinable by controlling the two or more noise sources via the two or more digital inputs.

Such a radio frequency integrated circuit may operate as part of a phased-array or directed-beam system.

In a third aspect of the invention, a noise amplifier circuit comprises a noise source for generating multiple levels of input noise, the noise source comprising a bipolar transistor operating in an avalanche breakdown mode, the noise source being controllable by a digital input, and an amplifier coupled to the noise source for amplifying the input noise generated by the noise source.

The bipolar transistor may be a silicon-germanium negative-positive-negative bipolar transistor, wherein the bipolar transistor is biased at a collector-to-emitter voltage greater than a collector-to-emitter breakdown voltage with an open-circuited base. Further, in another embodiment, the noise amplifier circuit may further comprise a switch that is controllable by another digital input, wherein the switch provides for selection of an input impedance value.

In a fourth aspect of the invention, a method of manufacturing a radio frequency integrated circuit comprises the steps of forming at least one noise source on the radio frequency integrated circuit, the noise source being controllable by a digital input and being formed in accordance with a silicon fabrication process, and forming a radio frequency circuit on the radio frequency integrated circuit coupled to the noise source, wherein at least one attribute of the radio frequency circuit is determinable by controlling the noise source via the digital input.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention will be explained below in the context of millimeter (mm) wave integrated circuits (IC). However, it is to be understood that the present invention is not limited to this particular type of IC or chip. Rather, the invention is more generally applicable to any radio frequency IC (RFIC) where it would be desirable to simplify the manufacturing test of the RFIC by incorporating one or more on-chip RF noise source(s) into the IC, e.g., into the RF front-end of the IC. The inventive techniques are particularly useful for RFICs operating at mm-wave frequencies for which more conventional manufacturing test methods are difficult, time-consuming, and costly. The techniques are also particularly applicable to RFICs intended for use in phased-array or directed-beam systems, which may have many RF inputs and be impractical to test in any other way.

In accordance with the present invention, the input circuitry (typically a low-noise amplifier or LNA) at each of the RF inputs of the RFIC under test incorporates a noise source on the RFIC which can be used to test the NF and insertion gain of the RFIC without making any electrical contact to the RF inputs of the RFIC. In one particular implementation, the noise source comprises a Silicon-Germanium (SiGe) negative-positive-negative (NPN) bipolar transistor which is biased at a collector-to-emitter voltage ($V_{CE}$) greater than the device's collector-to-emitter breakdown voltage with the base open-circuited (BVceo). Under these conditions, the device operates in avalanche breakdown mode, just as most noise-source diodes do. This operating mode is particularly advantageous because noise generated at the collector-base junction is multiplied by the current gain of the NPN transistor, resulting in large noise output for a given current level and device area. Alternate implementations using PN junction diodes typically found in Si CMOS processes are possible.

Figure 1:
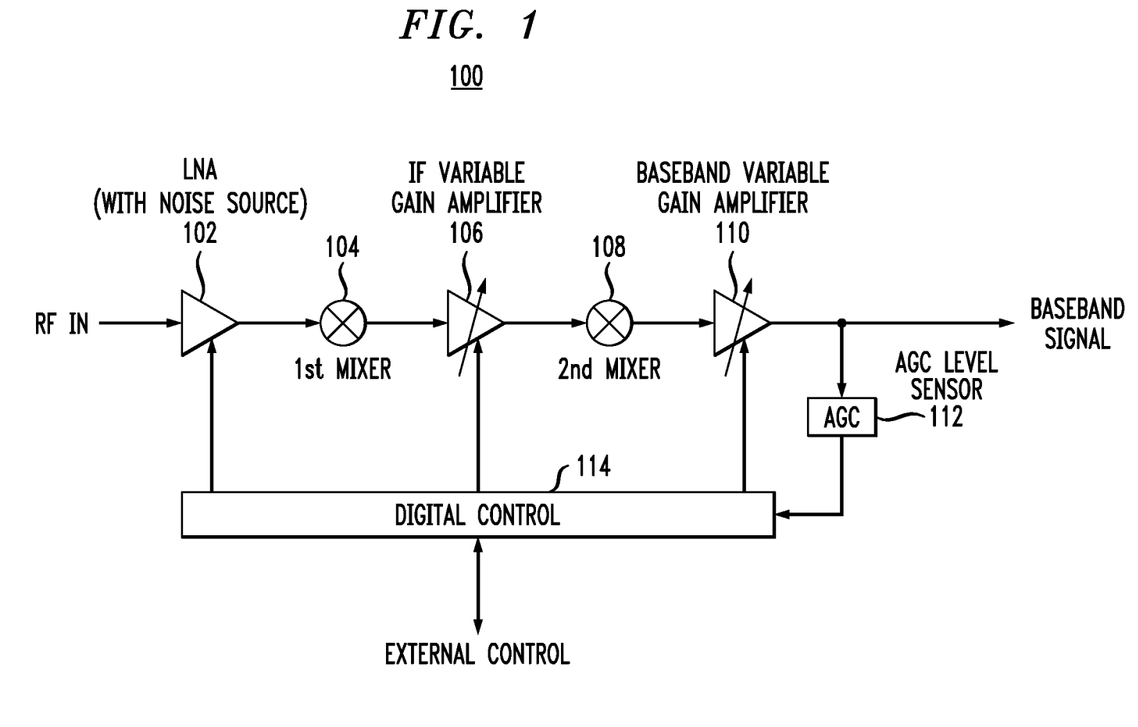
FIG. 1 shows a radio receiver integrated circuit incorporating an on-chip noise source in the input low-noise amplifier, according to an embodiment of the present invention.

FIG. 1 depicts a block diagram of a radio receiver IC incorporating an on-chip noise source in the input LNA, according to an embodiment of the present invention. As shown, receiver 100 comprises LNA 102, first mixer 104, intermediate frequency (IF) variable gain amplifier 106, second mixer 108, baseband variable gain amplifier 110, automatic gain control (AGC) 112, and digital control circuitry 114. It is to be appreciated that FIG. 1 does not necessarily illustrate all components that a radio receiver IC may include, but rather shows the main components that are relevant to an understanding of the principles of the invention.

In this particular embodiment, the noise source that will be used for self test purposes is incorporated into LNA 102. The IF mixer/amplifier combination (104/106) and the baseband mixer/amplifier combination (108/100) operate in a conventional manner.

AGC 112 acts as a signal level sensor at the receiver baseband output ("AGC Level Sensor") which provides output signal level information to digital control circuitry 114. The digital control circuitry provides digital outputs to externally control the gain, bandwidth, and tuning of the receiver, as well as the state of the noise source in the LNA. Such external control may be provided by an external source (system or person), not expressly shown. By measuring the change in output power of the receiver with the noise source on and off, the noise figure (NF) and insertion gain of the receiver can be measured in response to external digital control signals. The external controller or tester does not need to provide or receive mm-wave RF or analog signals.

Figure 2A:
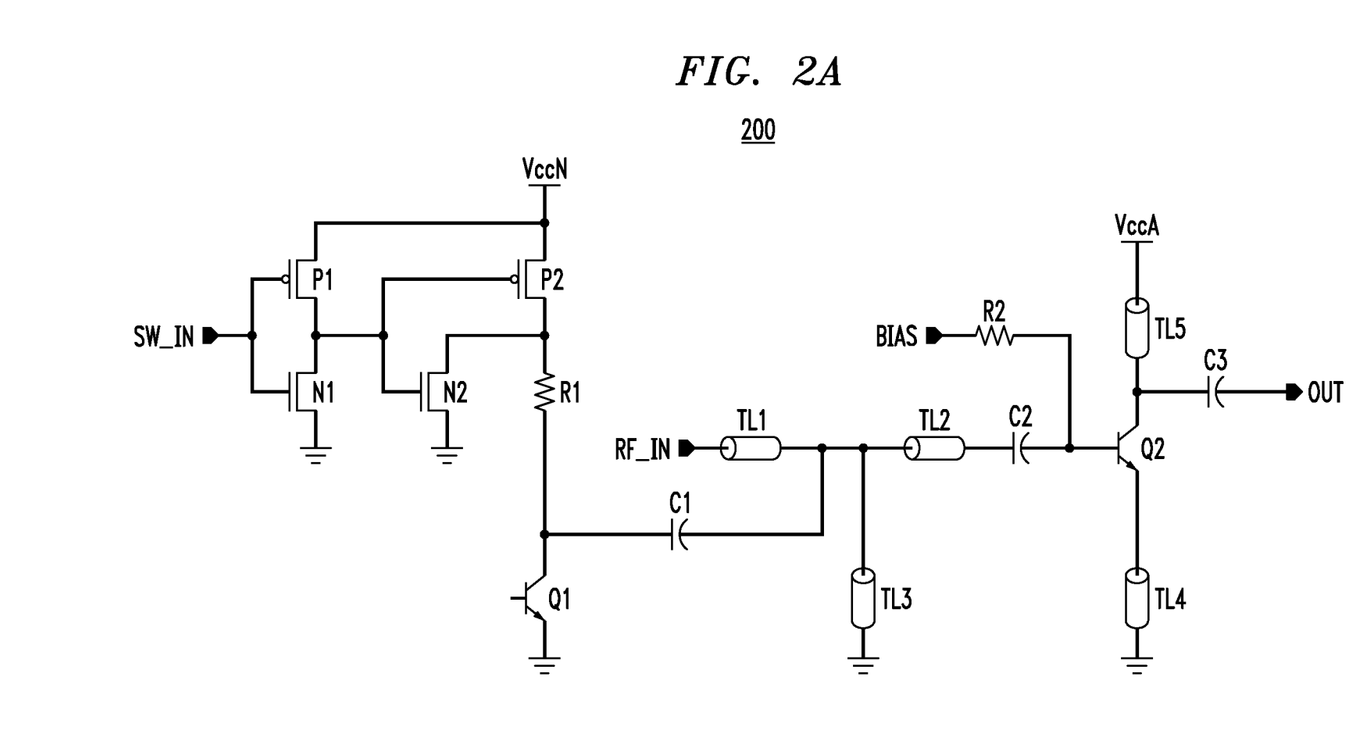
FIG. 2A shows a first stage of low-noise amplifier incorporating a noise source for use in performing on-chip testing, according to an embodiment of the present invention.

FIG. 2A is a schematic of a first stage (200) of LNA 102 in receiver 100, according to an embodiment of the present invention. Within the LNA, a first stage of amplification is provided by Q2, a degenerated common-emitter amplifier. Degeneration inductance is provided by a short length of transmission line TL4, while transmission line TL5 provides a load inductance. The supply voltage for Q2 is labeled "VccA" and is selected to be less than the BVceo of Q2. In the particular SiGe BiCMOS technology used for this RFIC, the BVceo for the high-performance NPN Q2 is 1.75 V, and VccA is 1.35 V. Transmission lines TL1-TL3 comprise an input impedance matching network, which provides a near optimal impedance to minimize the NF of Q2 while also matching the RF input "RF_IN" to 50Ω. The noise source is realized by Q1; the base terminal of Q1 is left unconnected.

FETs P1, P2, N1 and N2 are arranged such that, when the digital input "SW_IN" is at a logic-high level, the load resistor R1 is pulled to the supply rail labeled "VccN". VccN is 2.7

V, well above BVceo for Q1, so Q1 is biased into avalanche breakdown with the current limited by R1, and noise is coupled by capacitor C1 to the input of Q2. On the other hand, when the digital input "SW_IN" is at a logic low level, the load resistor R1 is pulled to ground and Q1 is turned off. With the noise source in the off state, the only affect on the circuit is the shunt resistance of R1 and the shunt capacitance of Q1. The resistance of R1 is chosen large enough not to affect the input impedance of the circuit. The area of Q1 is chosen to minimize the parasitic capacitance, and what capacitance there is can be tuned out by adjusting the length of transmission line TL3. Other components shown in FIG. 2A but not expressly mentioned above can be assumed to operate in a conventional manner. It is to be understood that the digital input "SW_IN" is preferably provided by digital control 114.

Principles of the invention also realize that it might be advantageous to include circuitry to provide a known input impedance (typically 50Ω) at the input of the LNA while testing the NF. This known input impedance could be provided by an external circuit, or by connecting a resistor of known value from the RF input of the LNA to ground through a transistor switch.

Figure 2B:
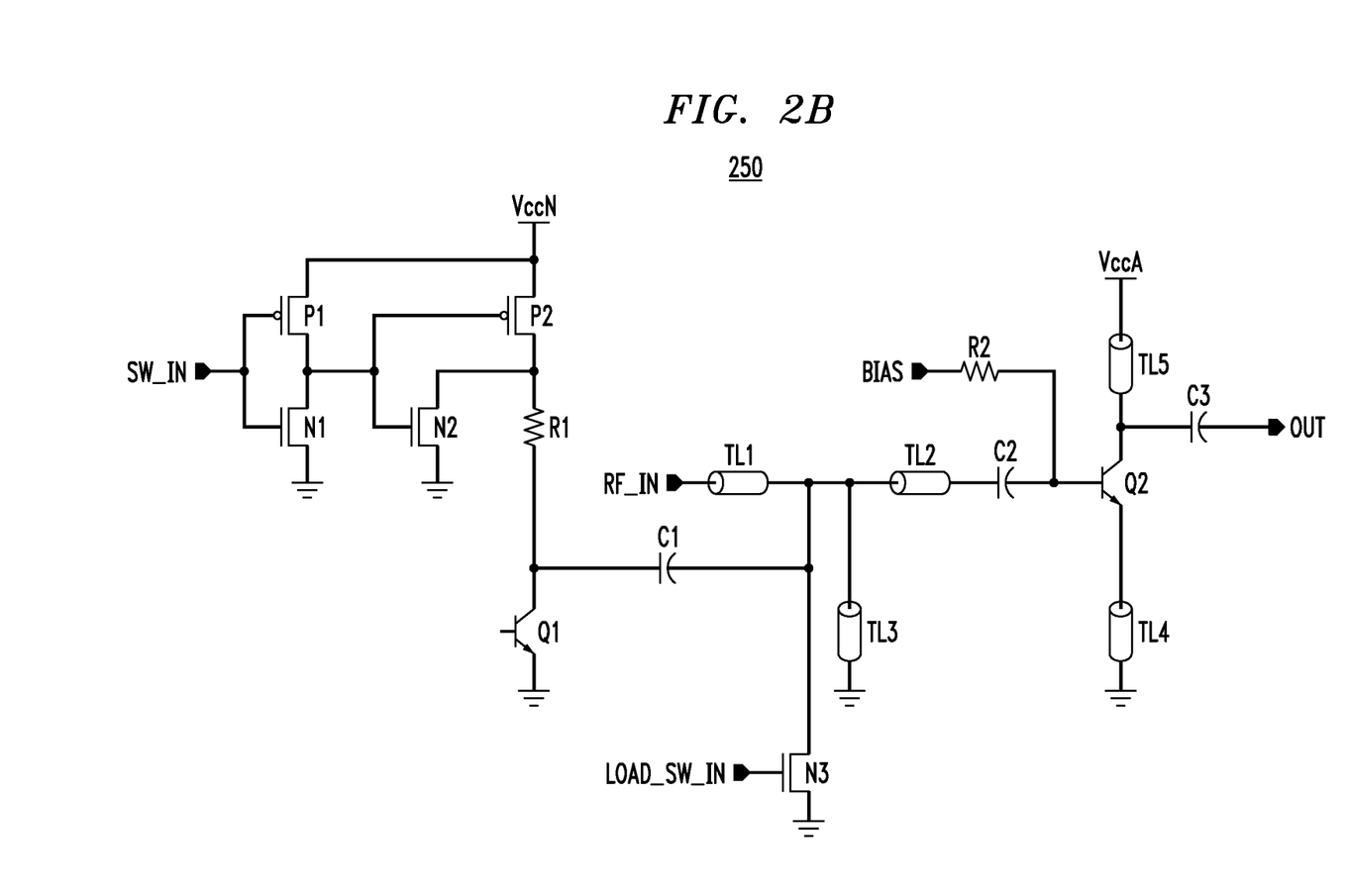
FIG. 2B shows a first stage of low-noise amplifier incorporating a noise source for use in performing on-chip testing, according to another embodiment of the present invention.

FIG. 2B shows one possible embodiment of such an LNA circuit which can provide known input impedance while testing the NF. It is to be understood that while the circuit (250) of FIG. 2B includes the same components (and functions) as the circuit of FIG. 2A, an n-channel MOSFET N3 has been included which can be turned on with digital input "LOAD_SW_IN". The conductance of N3 in its on-state is selected to provide (typically) 50-Ω impedance from the LNA input to ground. It is to be understood that the digital input "LOAD_SW_IN" is preferably provided by digital control 114.

It is to be appreciated that FIGS. 2A and 2B are not the only possible realizations of the present invention. Other circuits which include a switchable, on-chip noise source would also fulfill the requirements.

Figure 3:
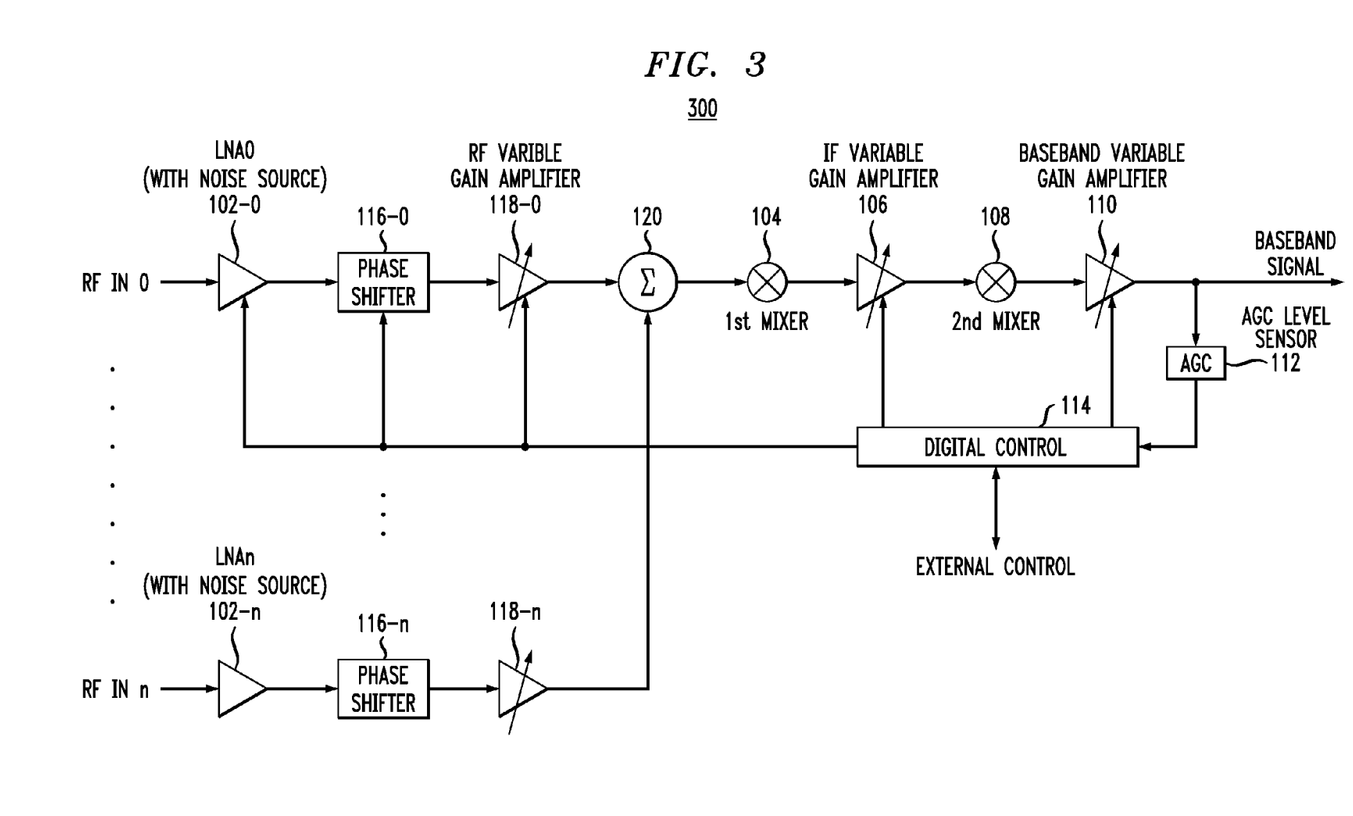
FIG. 3 shows a radio receiver integrated circuit with multiple radio frequency inputs incorporating on-chip noise sources in input low-noise amplifiers, according to an embodiment of the present invention.

FIG. 3 shows how principles of the present invention can be easily extended to allow testing of RFICs with many inputs. The additional circuitry needed in each LNA to realize the noise source is very small, allowing this testing method to be used on phased-array or directed-beam RFICs with minimal overhead.

As shown, like receiver 100 in FIG. 1, receiver 300 comprises first mixer 104, intermediate frequency (IF) variable gain amplifier 106, second mixer 108, baseband variable gain amplifier 110, automatic gain control (AGC) 112, and digital control circuitry 114. However, in accordance with a phased-array configuration, there is now a plurality of RF front-ends (0 through n), each with an LNA 102, a phase shifter 116, and an RF variable gain amplifier 118. The outputs of all the RF front-ends are summed in summer 120, and the summer output is provided to the IF stage of the receiver as is known. The phase shifters and RF amplifiers perform conventional functions in accordance with digital control 114. It is to be appreciated that, in accordance with principles of the present invention, each LNA comprises a noise source for use in performing on-chip testing. By way of example, each LNA may comprise one of the circuit shown in FIG. 2A or 2B.

Figure 4A:
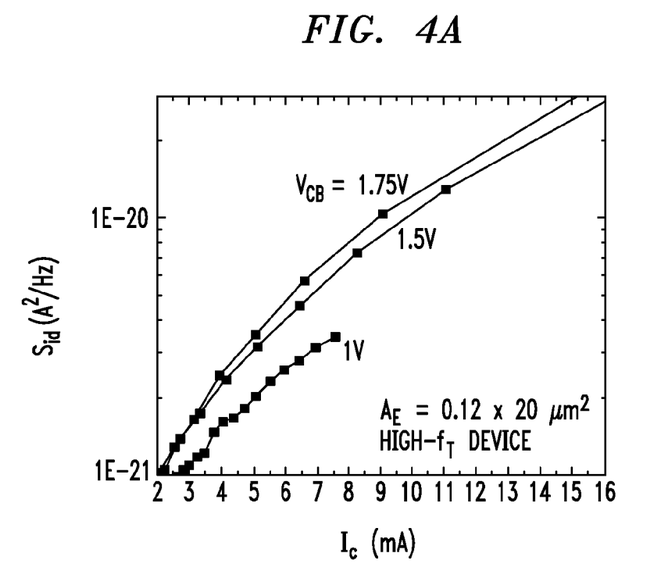
FIGS. 4A and 4B show noise current generated by an NPN SiGe bipolar transistor operating under the avalanche breakdown (impact ionization) conditions, according to an embodiment of the present invention.
Figure 4B:
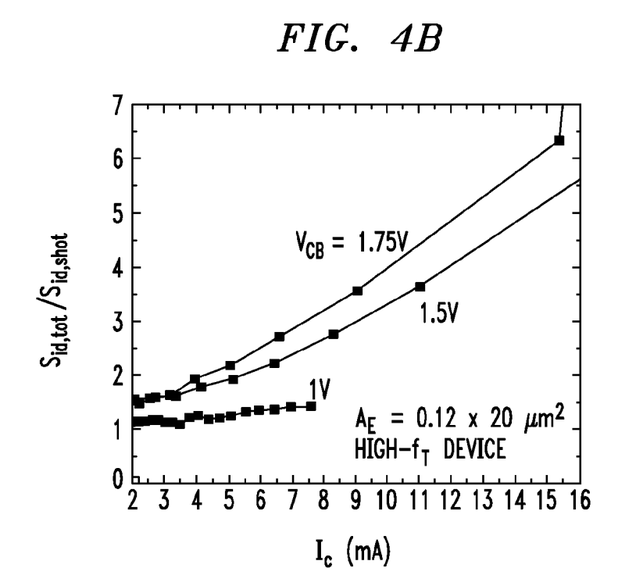

It is well known that bipolar transistors generate excess noise (i.e., noise in excess of that which would be generated by collector current shot noise alone) when operated in collector-emitter avalanche breakdown mode. FIGS. 4A and 4B show the noise current generated by an NPN SiGe bipolar transistor operating under the avalanche breakdown (impact ionization) conditions, as would be the case in the circuit of FIG. 1.

FIG. 4A shows the total noise current generated by the transistor as a function of bias current $I_C$ and the applied collector-to-base voltage ($V_{CB}$). Part of the total noise is due to normal collector current induced shot noise (which is calculated as $2qI_C$), and part of the total is due to avalanche current induced noise.

FIG. 4B presents the same measured data, recalculated to show the ratio of avalanche noise to shot noise. For a collector bias current IC of 10 milliamp or mA (through a 20 micrometer (μm) emitter width device) and $V_{CB}$ of 1.5 V, avalanche noise current is approximately three times the shot noise current, for a noise power roughly 9.5 decibels (dB) higher than that due to shot noise alone. This high noise power in the on-state is advantageous because it results in a high ratio of the two noise levels used to measure NF and insertion gain, yielding a more accurate and repeatable measurement. It is also advantageous because the increased noise output for a given device size and bias current allows a smaller area device to be used, resulting in less undesired parasitic capacitance and resistance added to the LNA, so that the performance of the LNA is not impaired by the addition of the noise source.

Advantageously, as described herein, principles of the invention provide a manufacturing test for the gain and noise figure of an RFIC which does not require making any electrical contact to the RF input(s) of the RFIC. Only the digital control and power supply pins of the IC need to be contacted. This is advantageous because the RF inputs require defined-impedance, high-frequency, low-loss wafer probes, whereas the digital and supply pins require only less expensive standard probe pins. By way of further advantage, principles of the invention introduce the concept of a noise source for manufacturing test or system calibration implemented entirely on an RFIC, using a standard Si fabrication process. Still further, principles of the invention provide for the use of a standard bipolar transistor operating in avalanche breakdown mode as a noise source.

Circuitry according to one more aspects of the present invention may be realized as integrated circuits; thus, at least a portion of the techniques of one or more aspects or embodiments of the present invention described herein may be implemented in an integrated circuit. In forming integrated circuits, a plurality of identical die are typically fabricated in a repeated pattern on a surface of a semiconductor wafer. Each die can include one or more of the circuits described herein, and may include other structures or circuits, or other types of cells. The individual die are cut or diced from the wafer, then packaged as an integrated circuit. A person of skill in the art will know how to dice wafers and package die to produce integrated circuits. Integrated circuits so manufactured are considered part of the present invention.

Circuits as described above can be part of the design for an integrated circuit chip. The chip design can be created, for example, in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GDSII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that includes integrated circuit chips.

Figure 5:
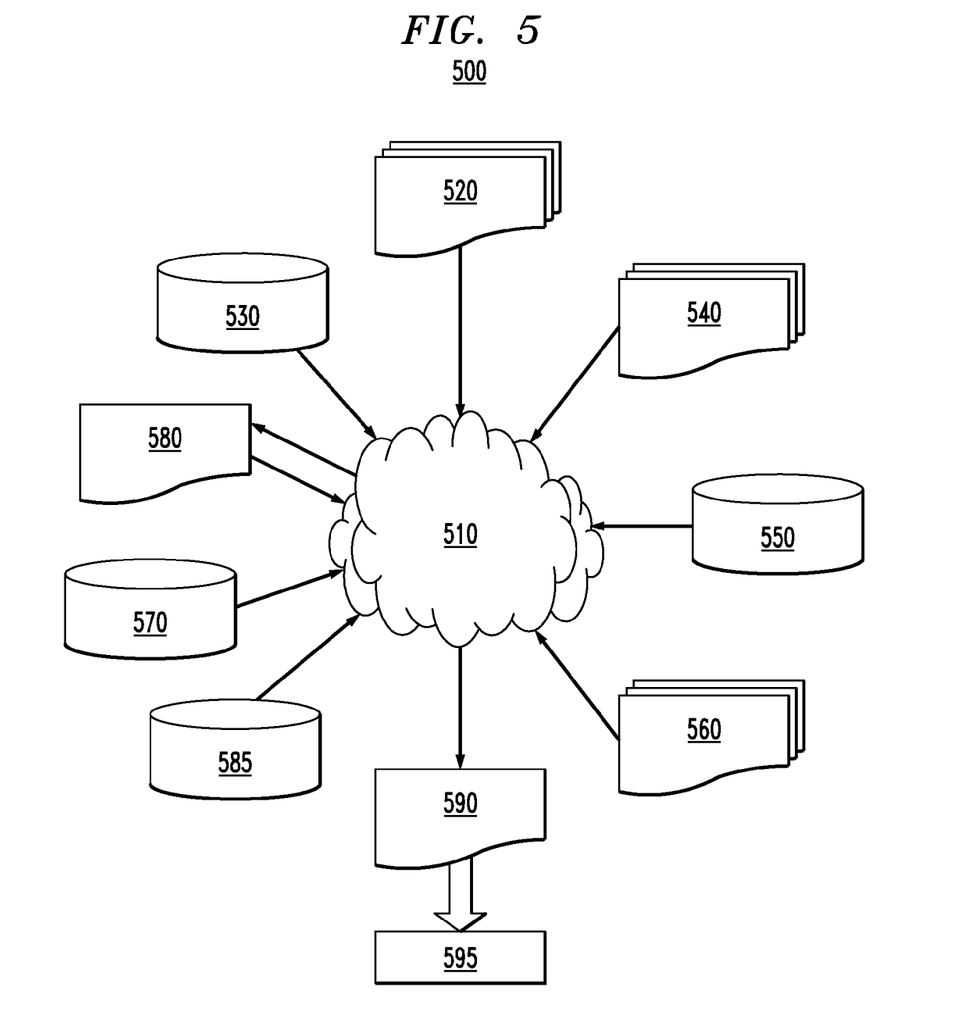
FIG. 5 shows an exemplary design flow used for example, in semiconductor design, manufacturing, and/or test, according to an embodiment of the present invention.

FIG. 5 shows a block diagram of an exemplary design flow 500 used for example, in semiconductor design, manufacturing, and/or test. Design flow 500 may vary depending on the type of IC being designed. For example, a design flow 500 for building an application specific IC (ASIC) may differ from a design flow 500 for designing a standard component. Design structure 520 is preferably an input to a design process 510 and may come from an IC provider, a core developer, or other design company or may be generated by the operator of the design flow, or from other sources. Design structure 520 comprises at least one of the embodiments of the invention as shown in FIGS. 1-3 in the form of schematics or HDL, a hardware-description language (e.g., Verilog, VHDL, C, etc.). Design structure 520 may be contained on one or more machine readable media. For example, design structure 520 may be a text file or a graphical representation of at least one of the embodiments of the invention as shown in FIGS. 1-3. Design process 510 preferably synthesizes (or translates) at least one of the embodiments of the invention as shown in FIGS. 1-3 into a netlist 580, where netlist 580 is, for example, a list of wires, transistors, logic gates, control circuits, I/O, models, etc. that describes the connections to other elements and circuits in an integrated circuit design and recorded on at least one machine readable medium. This may be an iterative process in which netlist 580 is resynthesized one or more times depending on design specifications and parameters for the circuit.

Design process 510 may include using a variety of inputs; for example, inputs from library elements 530 which may house a set of commonly used elements, circuits, and devices, including models, layouts, and symbolic representations, for a given manufacturing technology, design specifications 540, characterization data 550, verification data 560, design rules 570, and test data files 585 (which may include test patterns and other testing information). Design process 510 may further include, for example, standard circuit design processes such as timing analysis, verification, design rule checking, place and route operations, etc. One of ordinary skill in the art of integrated circuit design can appreciate the extent of possible electronic design automation tools and applications used in design process 510 without deviating from the scope and spirit of the invention. The design structure of the invention is not limited to any specific design flow.

Design process 510 preferably translates at least one of the embodiments of the invention as shown in FIGS. 1-3, along with any additional integrated circuit design or data (if applicable), into a second design structure 590. Design structure 590 resides on a storage medium in a data format used for the exchange of layout data of integrated circuits and/or symbolic data format (e.g., information stored in a GDSII (GDS2), GL1, OASIS, map files, or any other suitable format for storing such design structures). Design structure 590 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce at least one of the embodiments of the invention as shown in FIGS. 1-3. Design structure 590 may then proceed to a stage 595 where, for example, design structure 590: proceeds to tape-out, is released to manufacturing, is released to a mask house, is sent to another design house, is sent back to the customer, etc.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A radio frequency integrated circuit, comprising:
   at least one noise source residing on the radio frequency integrated circuit, the noise source being controllable by a digital input signal to the noise source, wherein the digital input signal enables generation of a noise signal by the noise source such that the noise source generates the noise signal in response to receipt of the digital input signal, and wherein the digital input signal is operable in a first state to connect a supply voltage to the noise source enabling generation of the noise signal by the noise source, and in a second state to disconnect the supply voltage from the noise source, thereby preventing generation of the noise signal by the noise source; and
   a radio frequency circuit residing on the radio frequency integrated circuit and being coupled to the noise source, wherein at least one attribute of the radio frequency circuit is determinable by controlling the noise source via the digital input signal.

2. The radio frequency integrated circuit of claim 1, wherein the noise source is integrated in the radio frequency circuit.

3. The radio frequency integrated circuit of claim 1, wherein the noise source is part of a low-noise amplifier of the radio frequency circuit.

4. The radio frequency integrated circuit of claim 1, wherein the attribute of the radio frequency circuit determinable by controlling the noise source via the digital input signal is a noise figure value.

5. The radio frequency integrated circuit of claim 1, wherein the attribute of the radio frequency circuit determinable by controlling the noise source via the digital input signal is an insertion gain value.

6. The radio frequency integrated circuit of claim 1, wherein controlling the noise source via the digital input signal results in applying two different levels of input noise to the radio frequency circuit and measuring an output power change of the radio frequency circuit.

7. The radio frequency integrated circuit of claim 1, wherein the radio frequency circuit residing on the radio frequency integrated circuit operates in approximately a millimeter wave frequency range.

8. The radio frequency integrated circuit of claim 1, wherein the radio frequency integrated circuit operates as a radio receiver.

9. The radio frequency integrated circuit of claim 1, wherein the noise source comprises a bipolar transistor operating in an avalanche breakdown mode.

10. The radio frequency integrated circuit of claim 9, wherein the bipolar transistor is a silicon-germanium NPN bipolar transistor, wherein the bipolar transistor is biased at a collector-to-emitter voltage greater than a collector-to-emitter breakdown voltage with an open-circuited base.

11. A radio frequency integrated circuit, comprising:
two or more noise sources residing on the radio frequency integrated circuit, the two or more noise sources being respectively controllable by two or more digital input signals to the two or more noise sources, wherein the two or more digital input signals enable generation of two or more noise signals by the two or more noise sources such that the two or more noise sources generate the two or more noise signals in response to receipt of the two or more digital input signals, and wherein the two or more digital input signals are operable in a first state to connect two or more supply voltages to the two or more noise sources enabling generation of the two or more noise signals by the two or more noise sources, and in a second state to disconnect the two or more supply voltages from the two or more noise sources, thereby preventing generation of the two or more noise signals by the two or more noise sources; and a radio frequency circuit with two or more radio frequency inputs, the radio frequency circuit residing on the radio frequency integrated circuit and being coupled to the two or more noise sources, wherein corresponding ones of the two or more noises sources are associated with corresponding ones of the two or more radio frequency inputs, and further wherein at least one attribute of the radio frequency circuit is determinable by controlling the two or more noise sources via the two or more digital input signals.

12. The radio frequency integrated circuit of claim 11, wherein the attribute of the radio frequency circuit determinable by controlling the two or more noise sources via the two or more digital input signals is a noise figure value.

13. The radio frequency integrated circuit of claim 11, wherein the attribute of the radio frequency circuit determinable by controlling the two or more noise sources via the two or more digital input signals is an insertion gain value.

14. The radio frequency integrated circuit of claim 11, wherein the radio frequency circuit residing on the radio frequency integrated circuit operates in approximately a millimeter wave frequency range.

15. The radio frequency integrated circuit of claim 11, wherein the radio frequency integrated circuit operates as a radio receiver.

16. The radio frequency integrated circuit of claim 11, wherein the radio frequency integrated circuit operates as part of a phased-array or directed-beam system.

17. The radio frequency integrated circuit of claim 11, wherein the two or more noise sources are integrated in the radio frequency circuit.

18. The radio frequency integrated circuit of claim 11, wherein the two or more noise sources are respectively part of two or more low-noise amplifiers of the radio frequency circuit.

19. A method of manufacturing a radio frequency integrated circuit, comprising the steps of:
forming at least one noise source residing on the radio frequency integrated circuit, the noise source being controllable by a digital input signal to the noise source, wherein the digital input signal enables generation of a noise signal by the noise source such that the noise source generates the noise signal in response to receipt of the digital input signal, and wherein the digital input signal is operable in a first state to connect a supply voltage to the noise source enabling generation of the noise signal by the noise source, and in a second state to disconnect the supply voltage from the noise source, thereby preventing generation of the noise signal by the noise source; and forming a radio frequency circuit on the radio frequency integrated circuit coupled to the noise source, wherein at least one attribute of the radio frequency circuit is determinable by controlling the noise source via the digital input signal.

* * * * *